United States Patent [19]

Crisafulli

[11] Patent Number: 5,289,118
[45] Date of Patent: Feb. 22, 1994

[54] PROGRAMMER/TESTER WITH ELECTRONICALLY SWITCHED BYPASS CAPACITOR

[75] Inventor: Kellee J. Crisafulli, Redmond, Wash.

[73] Assignee: Data I/O Corporation, Redmond, Wash.

[21] Appl. No.: 648,786

[22] Filed: Feb. 1, 1991

[51] Int. Cl.⁵ .............................................. G01R 31/00
[52] U.S. Cl. .................................. 324/158 R; 324/73.1
[58] Field of Search ........... 324/158 D, 158 F, 158 P, 324/73.1; 371/22.1, 22.3, 22.4, 15.1, 16.1; 307/296.6; 437/8; 257/48

[56] References Cited

U.S. PATENT DOCUMENTS

| | | | |
|---|---|---|---|
| 4,644,265 | 2/1987 | Davidson et al. | 324/158 R |
| 4,689,556 | 8/1987 | Cedrone | 324/158 F |
| 4,970,460 | 11/1990 | Jensen et al. | 324/158 F |
| 5,157,328 | 10/1992 | Hashiguchi | 324/158 R |

*Primary Examiner*—Vinh Nguyen
*Attorney, Agent, or Firm*—Seed & Berry

[57] ABSTRACT

A circuit is disclosed for use in testing and programming electronic devices. The circuit provides an electronic wave of connecting bypass capacitors to selective device pins. The circuit includes first and second diodes that are coupled intermediate first and second bypass capacitors and a device node and to the second capacitor to charge the first and second capacitors. A current source is coupled to the first and second bypass nodes to forward bias a first and second diodes, thereby coupling the device node to the first and second capacitors. To selectively decouple the first and second bypass capacitors, voltage sources are coupled to the bypass node, thereby reverse biasing the first and second diodes and effectively disconnecting the first and second bypass capacitors from the device node.

14 Claims, 4 Drawing Sheets

PROGRAMMER/TESTER WITH ELECTRONICALLY SWITCHED BYPASS CAPACITOR

DESCRIPTION

1. Technical Field

The present invention is directed toward bypass capacitors for use with semiconductor circuits and, more particularly, toward an apparatus for selectively switching a bypass capacitor to one of several pins of a semiconductor circuit.

2. Background of the Invention

Semiconductor circuits typically include several pins, one or more of which receive a supply voltage for use by the semiconductor circuit. The other pins of the semiconductor circuit generally supply and/or receive electrical signals, i.e., input/output signals, to and from the semiconductor circuit. Typically, several semiconductor circuits are mounted on a circuit board to perform a preselected function. Examples of circuit boards include the "mother board" of a personal computer and the interface board of a personal computer. Other circuit boards temporarily receive semiconductor circuits to test or program the semiconductor circuit. Most circuit boards include several supply voltages, each having a predetermined potential, and a single source for each supply voltage. The supply voltages are connected to the appropriate semiconductor circuits using conventional circuit board "etching" techniques. In addition, conventional circuit boards usually provide a ground plane, i.e., a node of common potential having a relatively large surface area, proximate each semiconductor circuit. Ground planes provide an accurate reference potential for semiconductor circuits on the circuit board.

In operation, the output signals of the semiconductor circuits on a circuit board switch between various states. When the semiconductor circuits switch, they require a relatively large intermittent supply of electrical energy. It has been found, however, that when the single source of the supply voltage is located relatively remote from the semiconductor circuits, the line impedance of the conductor connecting the supply voltage to the semiconductor circuits can cause variations in the supply voltage at the semiconductor circuit. Variations in the voltage supplied to semiconductor circuits sometimes causes temporary discontinuities in the output signals of the semiconductor circuits. These temporary discontinuities are commonly referred to as overshoot, undershoot, ringing, logical glitches, etc. Such temporary discontinuities, may cause the semiconductor circuit exhibiting the discontinuity, or other semiconductor circuits on the circuit board to malfunction and, therefore, prevent the circuit board from performing its intended function.

To prevent discontinuities that result from the intermittent power requirements of semiconductor circuits, bypass capacitors are typically connected between the semiconductor circuit supply voltage pin and the ground plane of the circuit board. The bypass capacitors have a capacitance sufficient to stabilize the value of the voltage supply by providing the intermittent power required by the semiconductor circuit to which they are coupled. For printed circuit boards that are being mass-produced, bypass capacitors are designed into the circuit board arrangement and soldered to the printed circuit board proximate the semiconductor circuits. In this manner, the effect of line impedance between the supply voltages and the semiconductor circuits is minimized. However, this method of providing bypass capacitors is unacceptable where a semiconductor circuit is to be temporarily mounted on the circuit board for programming and/or testing.

Circuit boards that are constructed for programming and/or testing semiconductor circuits, referred to herein as "programmers/testers," preferably have a socket, or other releasable coupler, for receiving semiconductor circuits having a variety of pin configurations. The location of the pin receiving the supply voltage may vary from one pin configuration to another. Accordingly, depending on the pin configuration of the semiconductor circuit, any pin of the temporary socket may require a bypass capacitor. It is undesirable to permanently connect bypass capacitors between preselected pins of the socket and the ground plane since this construction will only accommodate a limited number of pin configurations, i.e., those pin configurations that have pins designed to receive supply voltages positioned in the preselected locations. Also, connecting bypass capacitors between input or output pins and the ground plane can degrade signals applied to or output from such pins.

It is also undesirable to connect a bypass capacitor between each pin of the temporary socket and the ground plane because bypass capacitors connected to output pins increase the power necessary to drive those pins and, consequently, increases the intermittent power demands of the semiconductor circuits. Providing a bypass capacitor between each pin of the temporary socket and the ground plane therefore degrades the output signals from the semiconductor circuits during times of intermittent power demand resulting in, overshoot, undershoot, ringing, logical glitches, etc.

Further, it is impractical to manually solder, or otherwise manually couple, a bypass capacitor to the temporary socket of a programmer/tester circuit board. Such a procedure would be both time-consuming and tedious. Also, due to the ever decreasing size of semiconductor circuits, manual soldering of bypass capacitors would be extremely ineffective to adequately couple the bypass capacitor to the circuit board. An arrangement for a programmer/tester that utilized such a manual soldering procedure would also be visually unattractive and, consequently, less marketable.

It is therefore desirable to provide an apparatus for connecting bypass capacitors to any of a plurality of pins of a receiving socket of a programmer/tester. It is also desirable to provide an apparatus for selectively connecting bypass capacitors to any of a plurality of pins of a receiving socket of a programmer/tester. It is further desirable to provide an apparatus for remote and selective connecting of bypass capacitors to any of a plurality of pins of a receiving socket of a programmer/tester.

SUMMARY OF THE INVENTION

The present invention comprises a circuit that is responsive to first and second states of a bypass signal for selectively connecting a device node of an electrical circuit to a bypass capacitor so that the charge on the bypass capacitor can stabilize the voltage of the device node. The circuit includes a source of electrical energy that is responsive to the first and second states of the bypass signal for supplying electrical energy to first and second bypass nodes and the device node. More particularly, the source of electrical energy is responsive to the first state of the bypass signal for conducting current to and from the first and second bypass nodes, respectively. The source of electrical energy is responsive to the second state of the bypass signal for providing a potential difference between the first and second bypass nodes and the device node. A capacitor assembly is connected between the first and second bypass nodes and the reference potential for providing electrical energy to the first and second bypass nodes. Diodes are provided for conducting current from the first bypass node to the second bypass node. The diodes are responsive to the current conducted by the source of electrical energy for conducting current from the first bypass node to the device node and from the device node to the second bypass node so that the device node is effectively connected to the capacitor assembly. The diodes are also responsive to the potential difference between the first and second bypass nodes, provided by the source of electrical energy, to substantially prevent conduction of current between the first and second bypass nodes and the device node.

DETAILED DESCRIPTION OF THE INVENTION

Figure 1:
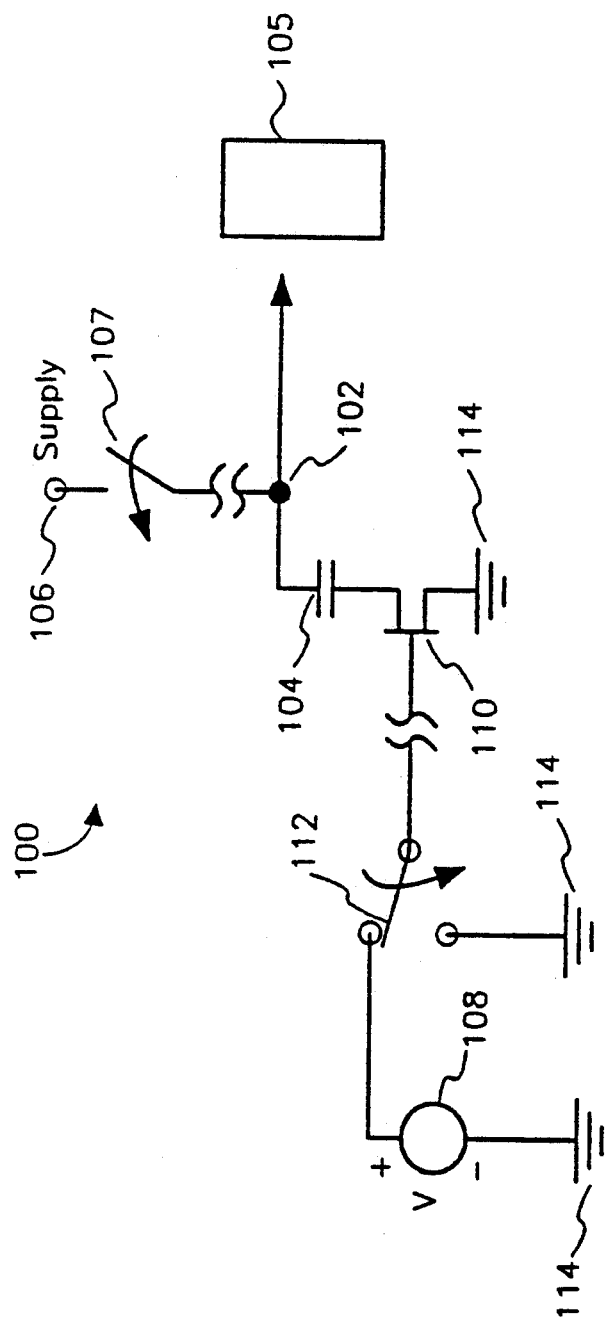
FIG. 1 is a schematic of a prior art bypass circuit for selectively connecting a shunt capacitance to a device node.

A prior art bypass circuit 100 is illustrated in FIG. 1. The bypass circuit 100 is constructed for selectively connecting a device node 102 of a circuit board (not shown) and a bypass capacitor 104 to a ground plane 114. The device node 102 is constructed to be connected to any of a plurality of pins of a semiconductor circuit 105. A switch 107 is provided for selectively connecting the device node 102 to a source of supply voltage 106 if the pin configuration of the semiconductor circuit 105 so requires. The source of supply voltage 106 may be located relatively remote from the semiconductor circuit 105 and the device node 102 so that, without the bypass circuit 100, the output of the semiconductor circuit 105 would exhibit discontinuity during times of high electrical energy demand due to the impedance in the line intermediate the supply voltage 106 and the device node 102. The circuit 100 selectively couples the bypass capacitor 104 between the device node 102 and ground when the device node 102 is connected to the supply voltage 106 to minimize the effect of line impedance during times of high electrical energy demand.

In this regard, a voltage supply 108 is connected to the gate of a field effect transistor (FET) 110 by way of a switch 112. The switch 112 is constructed to couple the gate of the field effect transistor (FET) 110 either to a ground plane 114 of the circuit board (not shown), or to the voltage supply 108. When the switch 112 is connected to the ground plane 114 open and the voltage supply 108 is disconnected from the field effect transistor (FET) 110, the field effect transistor (FET) 110 is turned off and the bypass capacitor 104 is preferably disconnected from the ground plane 114, thereby effectively disconnecting the capacitance of the bypass capacitor 104 from the device node 102. Conversely, when the switch 112 is connected to the voltage supply 108 so that the voltage supply 108 is connected to the gate of the field effect transistor (FET) 110, the field effect transistor (FET) 110 is turned on and the bypass capacitor 104 is connected to the ground plane 114 so that the capacitance of the bypass capacitor 104 is effectively connected intermediate the device node 102 and the ground plane 114. When the capacitance of the bypass capacitor 104 is connected intermediate the device node 102 and the ground plane 114 of the circuit board (not shown), the charge of the bypass capacitor 104 stabilizes the voltage of the device node 102. Since the voltage supply 108 supplies relatively low power to the field effect transistor (FET) 110, the voltage source 108 and the switch 112 may be located remote from the field effect transistor (FET) 110, the bypass capacitor 104, and the device node 102. Accordingly, the switch 112 may be used to selectively couple the bypass capacitor 104 to the device node 102.

Ideally, when the switch 112 is opened, very little capacitance will be connected to the device node 102. As discussed above, when the device node 102 supplies and/or provides input/output signals to and from the semiconductor device 105, i.e., when the device node 102 does not receive a supply voltage, high capacitive loads on the device node 102 require more power to be supplied to the device node 102 to drive the capacitance connected to the device node 102. It is desirable, therefore, to minimize the capacitance connected intermediate the device node 102 and the reference plane 114 of the circuit board (not shown) when the device node 102 is not receiving a supply voltage.

Those skilled in the art will recognize, however, that the bypass circuit 100 fails to meet the requirement of connecting a relatively low capacitance intermediate the device node 102 and the ground plane 114 when the switch 112 is opened. As is known in the art, field effect transistors (FETs) typically include a large junction capacitance intermediate the source and drain of the field effect transistor. When the switch 112 is opened, the junction capacitance of the field effect transistor (FET) 110 appears intermediate the bypass capacitor 104 and the ground plane 114. The combined capacitance of the capacitor 104 and the junction capacitance of the field effect transistor (FET) 110 provides an unacceptable load on input/output pins of the device node 102 for many circuit board applications. Accordingly, the bypass circuit 110 illustrated in FIG. 1 fails to effectively provide means for selectively switching a bypass capacitor to a plurality of pins of a semiconductor circuit.

Further, those skilled in the art will appreciate that it is desirable to provide a low bypass path resistance intermediate the bypass capacitor 104 and the ground plane 114 when the device node 102 is effectively connected to the bypass capacitor 104. This is because a high bypass path resistance intermediate the ground plane 114 and the bypass capacitor 104 will result in a substantial voltage drop across the field effect transistor (FET) 110 when the bypass capacitor 104 is supplying current to the device node 102. A large voltage drop across the field effect transistor (FET) 110 has the same effect of varying the value of the supply voltage provided to the device node 102 as the line impedance intermediate the device node 102 and the supply voltage 106. However, field effect transistors (FETs) typically include a substantially high junction resistance intermediate their source and drain. To minimize the junction resistance, a larger field effect transistor (FET) is required. Unfortunately, increasing the size of a field effect transistor (FET) results in a higher junction capacitance of the field effect transistor (FET). Therefore, the bypass circuit 100 further fails to provide an acceptable bypass path resistance intermediate the bypass capacitor 104 and the ground plane 114. Any attempt to reduce the bypass path resistance to an acceptable amount will result in further exacerbation of the already unacceptable junction capacitance provided by the field effect transistor (FET) 110.

Still further, the bypass circuit 100 requires that the voltage source 108 be adapted to provide a voltage $V_e$ that is the same polarity as the supply voltage 106 so that the field effect transistor (FET) will conduct current between the device node 102 and the bypass capacitor 104. Accordingly, the value that is selected for the voltage supply 106 limits the ability of the bypass circuit 100 to be used with all supply voltages that may be provided on a circuit board. More particularly, the voltage supply 108 must have either a positive or negative polarity with respect to the ground plane 114. The bypass circuit 100 is therefore only effective to stabilize supply voltages that have the same polarity as the voltage supply 108.

Figure 2:
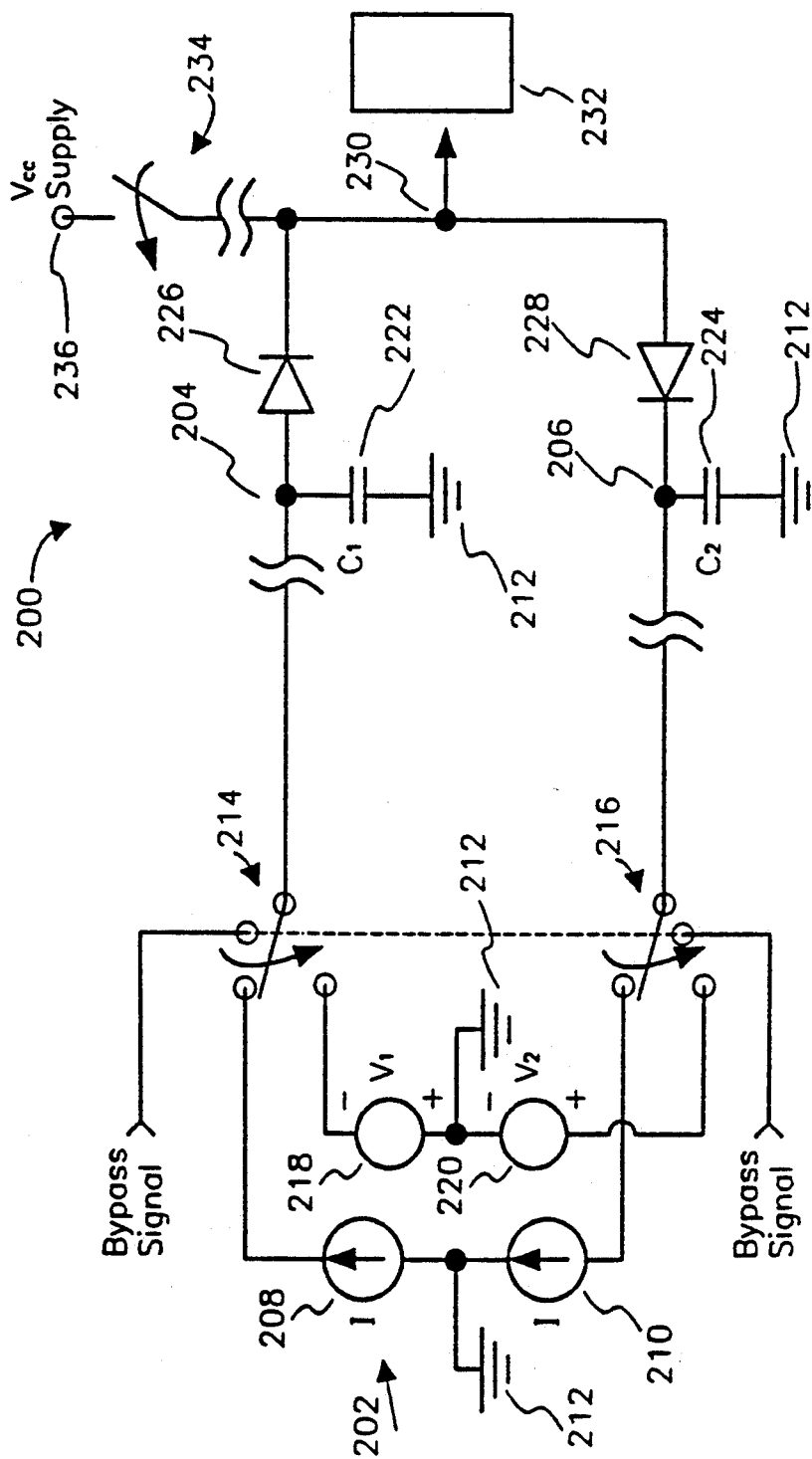
FIG. 2 is a schematic of the bypass circuit of the present invention for selectively shunting a device node of a semiconductor circuit to a bypass capacitance.

A bypass circuit 200, illustrated in FIG. 2, overcomes each of the disadvantages of the prior art bypass circuit 100. The bypass circuit 200 includes an electrical source subcircuit 202 that is controlled by a bypass signal to supply electrical energy to first and second bypass nodes 204 and 206. More particularly, as will be described in more detail below, when the bypass signal is in a first state, the electrical source subcircuit 202 conducts current to and from the first and second bypass nodes 204 and 206, respectively. When the bypass circuit is in a second state, the electrical source subcircuit 202 provides a potential difference between the first and second bypass nodes 204 and 206.

The electrical source subcircuit 202 includes first and second current sources 208 and 210 each connected to a reference plane 212 of the circuit board (not shown). The first and second current sources 208 and 210 are also connected to respective first and second switches 214 and 216. The first and second switches 214 and 216 connect the current sources 208 and 210 to the first and second bypass nodes 204 and 206, respectively, when the bypass signal is in its first state.

The electrical source subcircuit 202 also includes first and second voltage sources 218 and 220 that are connected to the ground plane 212. The first and second voltage sources are also respectively connected to the first and second switches 214 and 216. The first and second switches 214 and 216 connect the first and second voltage sources 218 and 220 to the first and second bypass nodes 204 and 206, respectively, when the bypass signal is in its second state.

The bypass circuit 200 includes first and second bypass capacitors 222 and 224 connected respectively to the first and second bypass nodes 204 and 206. Each of the first and second bypass capacitors 222 and 224 are also connected to the ground plane 212. The first and second bypass capacitors 222 and 224 are provided for storing charge to provide a potential difference between the first and second bypass nodes 204 and 206 and the ground plane 212. Accordingly, the first and second bypass capacitors may comprise any capacitor device capable of performing this function. Appropriate capacitance values for the first and second bypass capacitors 222 and 224 may be readily determined by those skilled in the art. Typical values for the first and second bypass capacitors 222 and 224 may be approximately equal to 0.01 microfarads.

First and second diodes 226 and 228 are connected intermediate the first and second bypass nodes 204 and 206, respectively, and a device node 230. The device node 230 is capable of being connected to any one of a plurality of pins of a semiconductor circuit 232. When the device node 230 is connected to a pin that requires a supply voltage, a switch 234 may be closed to couple a supply voltage 236 to the device node 230. As illustrated in FIG. 2, the magnitude of the supply voltage 236 is equal to $V_{cc}$. Although the supply voltage 236 is discussed herein as a single voltage, those skilled in the art will appreciate that a plurality of supply voltages may be provided on a circuit board and may be selectively coupleable to the device node 230. Further, as discussed in more detail below, the supply voltage 236 may be either positive or negative in polarity, or connected to the reference potential of the ground plane 212. Constructed in this manner, the bypass circuit 200 may be used to selectively couple the bypass capacitors 222 and 224 to the device node 230 for stabilizing the voltage of the device node 230.

The first and second diodes 226 and 228 are each conventional diodes conducting current from an anode to a cathode when the potential of the anode is greater than the potential of the cathode, i.e., when the first and second diodes 226 and 228 are forward-biased. Further, the first and second diodes 226 and 228 substantially prevent conduction of current between their anode and cathode when the potential of the cathode is greater than the potential of the anode, i.e., when the first and second diodes 226 and 228 are reverse-biased. Preferably, the first and second diodes 226 and 228 are selected to have a relatively small resistance when they are forward-biased so that when the bypass capacitors 222 and 224 supply charge to the device node 230, the incremental voltage drop across the first and second diodes 226 and 228 will be relatively small, as will be discussed in more detail below.

It will be apparent, therefore, to those skilled in the art that when the first and second switches 214 and 216 couple the first and second current sources 208 and 210 to the first and second bypass nodes 204 and 206, the bypass capacitors 222 and 224 will charge to voltage potentials equal to $V_{cc}+V_d$ and $V_{cc}-V_d$, respectively, wherein the voltage $V_d$ is equal to the voltage drop across the first and second diodes 226 and 228 when the first and second diodes are forward-biased, i.e., conducting current. Accordingly, in this configuration, any intermittent high power demands on the device node 230 by the semiconductor circuit 232 will be satisfied by the charge stored in the bypass capacitors 222 and 224. Conversely, when the first and second switches 214 and 216 are connected to the first and second voltage sources 218 and 220, the first and second diodes 226 and 228 will each be reverse-biased to substantially prevent current from being conducted between the first and second bypass nodes 204 and 206 and the device node 230.

Advantageously, the first and second diodes 226 and 228 may be selected to have a sufficiently small junction capacitance so that when the first and second bypass nodes 204 and 206 are disconnected from the device node 230, i.e., when the first and second diodes are reverse-biased, the capacitance provided intermediate the device node 230 and the reference plane 212 is at an acceptably low value. More particularly, the capacitance, C, intermediate the device nodes 230 and the reference plane 212 provided by the first and second capacitors 222 and 224 and the first and second diodes 226 and 228 when the first and second bypass nodes 204 and 206 are reverse-biased may be represented by the equation:

$$C = 2((C_1)(C_d)/(C_1 + C_d)) \quad (1)$$

wherein the capacitance of the first bypass capacitor 222 equals the capacitance of the second bypass capacitor 224 and wherein the junction capacitance of the first diode 226 equals the junction capacitance of the second diode 228 (referred to as $C_d$) when the first and second diodes are reversed biased. It will be apparent to those skilled in the art that the capacitance provided intermediate the device node 230 and the reference potential 212 when the diodes 226 and 228 are reverse-biased is approximately equal to twice the junction capacitance of the first and second diodes 226 and 228. If the first and second diodes 226 and 228 are selected to have a relatively small value, then the load placed on any input/output pins of the semiconductor circuit 232 will be acceptable.

Preferably, the current sources 208 and 210 are constructed to supply current to the first and second switches 214 and 216, respectively, wherein the currents have substantially the same magnitude and opposite polarity. Similarly, the first and second voltage sources 218 and 220 are preferably constructed to supply potentials for reverse biasing the first and second diodes 226 and 228, respectively, with respect to the device node 230. Appropriate devices for the first and second current sources 208 and 210 and the first and second voltage sources 218 and 220 may be readily constructed by those skilled in the art.

It will be apparent to those skilled in the art that the bypass circuit 200 illustrated in FIG. 2 is capable of shunting supply voltages having both positive and negative polarities by proper selection of the value of the voltages supplied by the first and second voltage sources 218 and 220. More particularly, the first voltage source 218 is preferably selected to provide a voltage having a magnitude that is greater than the magnitude of the highest negative voltage to be provided to the device node 230 so that when the switches 214 and 216 couple the voltage sources 220 and 216 to the bypass nodes 204 and 206, the diode 226 will be reverse-biased. Similarly, the voltage source 220 is preferably selected to provide a voltage having a value that is greater than the magnitude of the highest positive voltage to be provided to the device node 230 so that when the switches 214 and 216 couple the voltage sources 218 and 220 to the bypass nodes 204 and 206, the diode 228 will be reverse-biased. Further, those skilled in the art will appreciate that by providing a greater reverse bias potential across the first and second diodes 226 and 228, the reverse bias capacitance of the diodes will be smaller.

Further, although the switches 214 and 216 are illustrated as simple single pole double throw switches in FIG. 2, a plurality of arrangements may be substituted therefor. As illustrative examples, the switches 214 and 216 may comprise a mechanical or any type of electrical switch. Other arrangements for the first and second switches 214 and 216 will readily become apparent to those skilled in the art.

Figure 3:
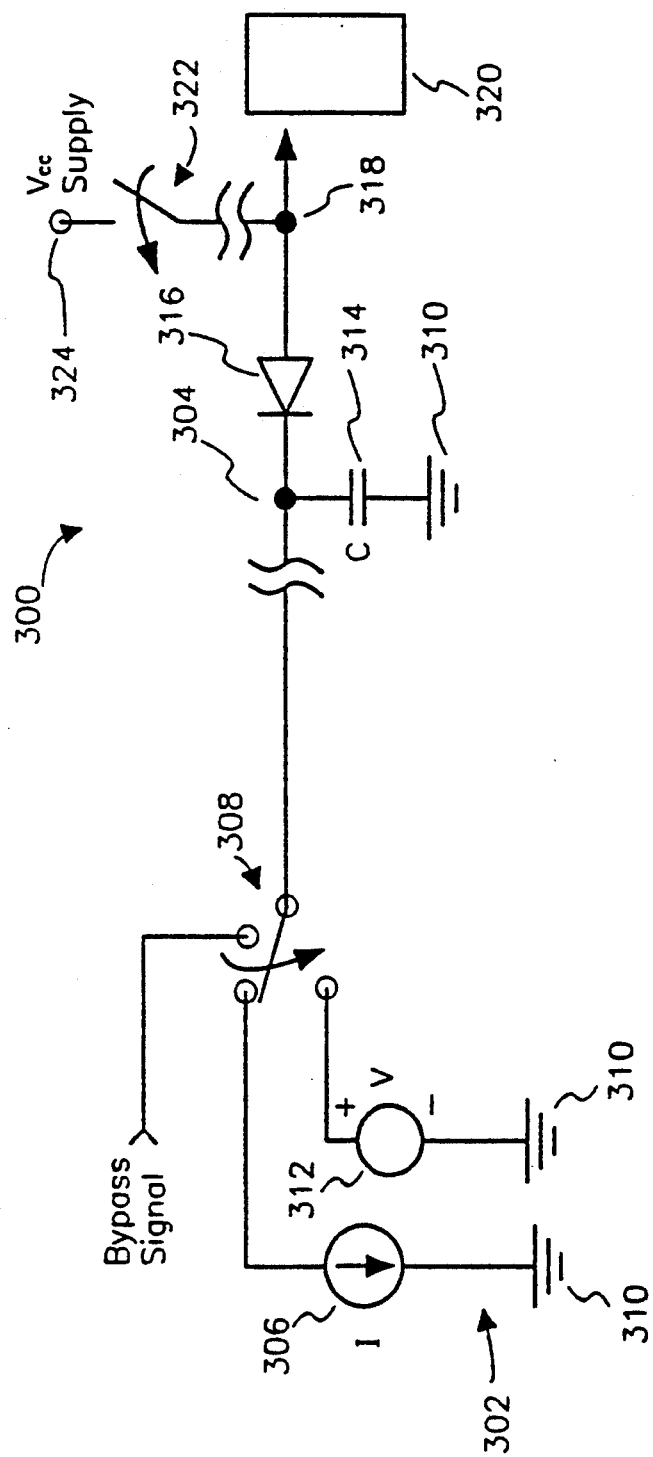
FIG. 3 is a schematic of an alternative embodiment of the bypass circuit of the subject invention.

An alternative embodiment for a bypass circuit 300 is illustrated in FIG. 3. The bypass circuit 300 includes an electrical source subcircuit 302 constructed for providing a supply of electrical energy to a bypass node 304. The electrical source subcircuit includes a current source 306 which is connected intermediate a switch 308 and the ground plane 310 of the circuit board (not shown). The switch 308 is responsive to a first state of a bypass signal for connecting the current source 306 to the bypass node 304. The electrical source subcircuit 302 also includes a voltage source 312 that is connected intermediate the switch 308 and the reference plane 310. The switch 308 is responsive to a second state of the bypass signal to couple the voltage source 312 to the bypass node 304. The current source 306 is provided for supplying current to the bypass node 304 for charging the bypass capacitor 314, as discussed above with the bypass circuit 200. The voltage source 312 is provided for establishing a potential difference between the bypass node 304 and the ground plane 310, as also discussed above by reference to the bypass circuit 200.

A bypass capacitor 314 is connected between the bypass node 304 and the ground plane 310 and includes a capacitance, C, selected for storing charge, as discussed above by reference to the first and second capacitors 222 and 224. A diode 316 includes a cathode connected to the bypass node 304 and an anode connected to a device node 318. The diode 316 conducts current from the bypass node 304 to the device node 318 when the potential of the bypass node 304 is less than the potential of the device node 318, as described above by reference to the first and second diodes 226 and 228. The diode 316 also substantially prevents conduction of current between the bypass node 304 and the device node 318 when the potential of the device node 318 is less than the potential of the bypass node 304. Like the first and second diodes 226 and 228, the diode 316 may have a small junction capacitance when the diode is reverse-biased. Also, the diode 316 may have a relatively large junction capacitance $C_{dc}$ when the diode is forward-biased.

The device node 318 is provided to be connected to any of a plurality of pins of a semiconductor circuit 320. When the device node 318 is connected to a pin that requires a supply voltage, a switch 322 may be closed to couple a supply voltage 324 to the device node 318.

In operation, the switch 308 responds to the first state of the bypass signal to couple the current source 306 to the bypass node 304. In this configuration, the capacitor 314 charges to a potential approximately equal to the potential of the supply voltage $V_{cc}$ minus the voltage across the diode $V_d$, i.e., $V_{cc} - V_d$. The diode 316 conducts current from the device node 318 to the current source 306. In so doing, the diode 316 achieves a junction capacitance equal to its conducting capacitance value. When the intermittent power demands of the semiconductor circuit 320 has the tendency to increase the potential of the device node 318, energy will be supplied to the device node 318 by the bypass capacitor 314, thereby stabilizing the voltage of the device node with respect to the reference plane 310. At times when the intermittent power demands of the semiconductor circuit 320 tend to decrease the potential of the device node 318, energy will also be supplied to the device node 318 by the capacitor 314. However, the increase in voltage of the device node 318 may be sufficient to turn off the diode 316, thereby substantially preventing conduction from the capacitor 314 to the device node 318. Nevertheless, since the junction capacitance of the diode 316 is relatively large when the diode is conducting, charge necessary to meet the intermittent power demand of the device node 318 may be supplied by the junction capacitance of the diode 316.

Like the bypass circuit 200 discussed above, the bypass circuit 300 substantially disconnects the bypass capacitor 314 from the bypass node 318 when the switch 308 is connected to the voltage source 312. In this regard, the switch 308 responds to a second state of the bypass signal to couple the voltage source 312 to the bypass node 314. The value of the voltage source 312 is selected to reverse bias the diode 316 so that the diode 316 substantially prevents conduction of current between the bypass node 304 and the device node 318. Since the junction capacitance of the diode 316 is relatively small when the diode is not conducting current, the serial combination of the junction capacitance of the diode 316 and the capacitance of the bypass capacitor 314 will be at an acceptably low level to meet the driving requirements of the output/input pins of the semiconductor circuit 320.

It will be apparent, however, to those skilled in the art, that the polarity of the current source 306 and the orientation of the diode 316 prevents the bypass circuit 300 from being used in combination with a supply voltage 324 having a negative polarity. To accommodate voltages of the device node 318 having a negative polarity, the current source 306 must be constructed to supply positive current to the biasing node 304 and the diode 316 must be oriented to conduct current from the biasing node 304 to the device node 318 when the diode is forward-biased.

The bypass circuits 200 and 300 of the present invention may be used in combination with a wide variety of circuit boards to selectively bias a plurality of nodes therein. In the presently preferred embodiment of the invention, the biasing circuits 200 and 300 are using in combination with a semiconductor circuit programmer/tester 400, illustrated in FIG. 4. The semiconductor circuit programmer/tester 400 of FIG. 4 includes a socket 402 for receiving a semiconductor circuit 404. The socket 402 may be constructed from one of a plurality of devices capable of receiving semiconductor circuits having varying pin constructions. The socket 402 includes a plurality of pins each connected to a bypass node 406. Each of the plurality of bypass nodes 406 is connected to a respective one of a plurality of charge supply circuits 408. Each charge supply circuit 408 may comprise first and second bypass capacitors and first and second diodes constructed as discussed above by reference to the first and second bypass capacitors 222 and 224 and the first and second diodes 226 and 228 (FIG. 2). Alternatively, each charge supply circuit 408 may comprise a single bypass capacitor connected to a single diode as discussed above by reference to the bypass capacitor 314 and the diode 316 (FIG. 3).

Figure 4:
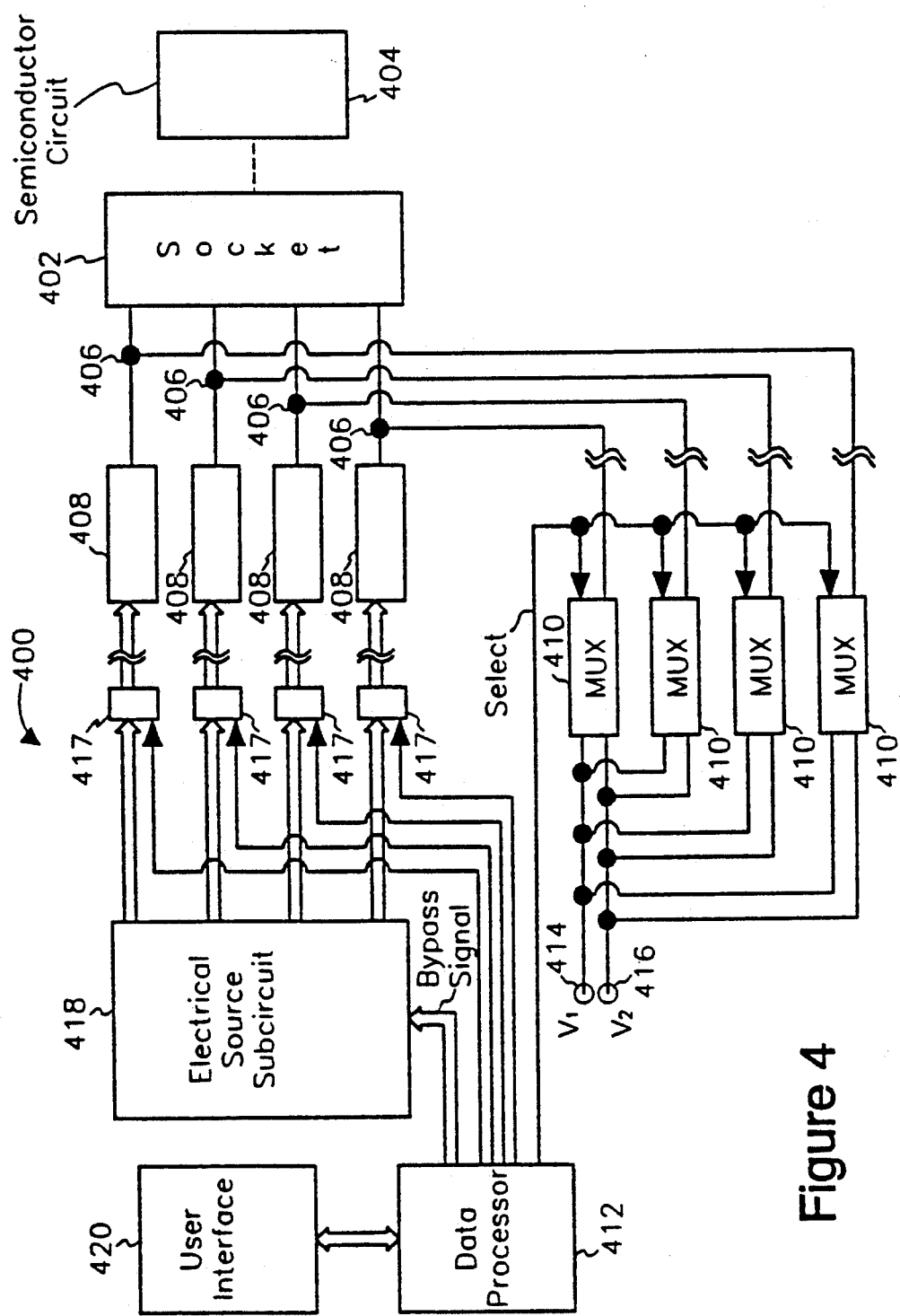
FIG. 4 is a block diagram of a programmer/tester including the bypass circuit of the present invention.

The plurality of device node 406 are also connected to a respective one of a plurality of multiplexers 410. Each of the plurality of multiplexers 410 responds to a select signal received from a data processor 412 to provide either a supply voltage 414 or a supply voltage 416 to the device node 406. Each of the plurality of multiplexers 410 may comprise any device, or combination of devices, for multiplexing a plurality of supply voltages to it respective one of the plurality of device nodes 406. Alternatively, a combination of devices could be provided for multiplexing a plurality of supply voltages with a plurality of device nodes. In the presently preferred embodiment of the invention, the plurality of multiplexers 410 comprise a network of relays multiplexing a plurality of supply voltages with a plurality of device nodes. Further, although only two supply voltages 414 and 416 are illustrated in FIG. 4, those skilled in the art will recognize that more supply voltages could be provided by altering the construction of the multiplexers 410. As discussed above by reference to FIG. 2, the supply voltages may be either positive or negative in polarity or may be connected to the reference potential of the ground plane.

The plurality of charge supply circuits 408 are also connected to a plurality of switches 417. The plurality of switches 417 couple an electrical source subcircuit 418 to respective ones of the plurality of charge supply circuits 408. The electrical source subcircuit 418 may comprise first and second current sources and first and second voltage sources, as discussed above by reference to the first and second current sources 208 and 210 and the first and second voltage sources 218 and 220 (FIG. 2). Alternatively, the electrical source subcircuit 418 may comprise a single current source and a single voltage source, as discussed above by reference to current source 306 and voltage source 312 (FIG. 3). The plurality of switches 417 may each comprise first and second switches, as discussed above by reference to the first and second switches 214 and 216 (FIG. 2) or may each comprise a single switch as discussed above by reference to the switch 308 (FIG. 3). Each switch 417 of the electrical source subcircuit 418 responds to a bypass signal provided by the data processor 412 for supplying either a current or a voltage to its respective one of the plurality of charge supply circuits 408, as discussed above by reference to FIGS. 2 and 3. Accordingly, the electrical source subcircuit 418 is constructed for providing either a voltage or a current to any one of the plurality of charge supply circuits 408.

As discussed above by reference to FIGS. 2 and 3, when a current is supplied to any of the plurality of the charge supply circuits 408, a bypass capacitance is effectively connected to its respective one of the plurality of device nodes 406, thereby to stabilize the supply voltage provided at the device node. Alternatively, when a voltage is provided to any one of the plurality of the charge supply circuits 408, the bypass capacitance is effectively disconnected from its respective one of the plurality of device nodes so that the capacitive load on its respective one of the plurality of device nodes 406 is at an acceptably low level.

The data processor 412 is connected to a user interface 420 for interfacing a user with the programmer/tester 400. The user interface may be constructed of conventional devices for receiving input from a user and providing status and data information to the user. The data processor 412 may be constructed for receiving the bypass signal directly from the user by way of the user interface 420 or, alternatively, the data processor 412 may be constructed for receiving information from the user, by way of the user interface 420, that identifies the semiconductor circuit 404 connected to the socket 402 and, in response to the received information, the data processor 412 may provide the appropriate bypass and select signals. Accordingly, the data processor 412 may include read only memory (ROM), random access memory (RAM), floppy disk drive, or other similar devices for storing data. Also, the data processor 412 may include other data processing circuitry, such as a microprocessor, timers, latches, buffers, drivers, etc.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A programmer/tester for programming semiconductor circuits of the type having a plurality of input/output pins and at least one pin designed to receive a supply voltage, said programmer/tester comprising:
   data processing means for providing a bypass signal and a select signal, said data processing means being responsive to user provided input for selectively providing said bypass signal in first and second states;
   socket means for receiving a semiconductor circuit, said socket means being constructed to couple a pin of the semiconductor circuit to a device node;
   supply voltage means responsive to said select signal for supplying a voltage having a predetermined magnitude to said device node;
   capacitor means for coupling a capacitance between a bypass node and a reference potential;
   electrical source means responsive to said bypass signal for coupling a supply of electrical energy to said bypass node, said electrical source means being responsive to said first state of said bypass signal for coupling a supply of electrical energy to said bypass node to charge said capacitor means and being responsive to said second state of said bypass signal for coupling a predetermined potential to said bypass node; and
   diode means responsive to the charge stored by said capacitor means for conducting current between said bypass node and said device node so that the charge stored by said capacitor means stabilizes the voltage of said device node, said diode means being responsive to the predetermined potential supplied to said bypass node to substantially prevent conduction of current between said bypass node and said device node.

2. The programmer/tester as recited in claim 1 further comprising user interface means for interfacing a user with said data processing means.

3. The programmer/tester as recited in claim 1 wherein said voltage supply means comprises a plurality of voltage supply circuits, said programmer/tester further comprising multiplexing means responsive to said select signal for selectively coupling said plurality of voltage supply circuits to said device node.

4. The programmer/tester as recited in claim 1 further comprising multiplexing means responsive to said select signal for coupling and decoupling said voltage supply means to said device node.

5. The programmer/tester as recited in claim 1 wherein said socket means comprises means for receiving a plurality of semiconductor circuits each having a different pin construction.

6. Apparatus for selectively bypassing a device node comprising:
   data processing means for providing a bypass signal and a select signal, said data processing means being responsive to user provided input for providing said bypass signal in first and second states;
   supply voltage means responsive to said select signal for coupling a supply voltage to the device node;
   capacitance means for selectively storing charge to stabilize the voltage of the device node, said capacitance means being coupled to a bypass node means;
   electrical source means responsive to said bypass signal for supplying electrical energy to said bypass node means, said electrical source means being responsive to said first state of said bypass signal for supplying electrical energy to said bypass node means to charge said capacitance means and being responsive to said second state of said bypass signal for supplying a predetermined voltage to said bypass node means; and
   diode means for selectively conducting current between said bypass node means and the device node, said diode means being responsive to the charge stored by said capacitance means for conducting current between said bypass node means and the device node so that the charge stored by said capacitance means stabilizes the voltage of the device node, said diode means being responsive to the predetermined voltage provided to said bypass node means by said electrical source means to substantially prevent conduction of current between said bypass node means and said device node.

7. The apparatus as recited in claim 6 further comprising socket means for releasably receiving a semiconductor circuit, said socket means being constructed to couple a pin of the semiconductor circuit to the device node.

8. The apparatus as recited in claim 7 wherein said socket means comprises means for receiving a plurality of semiconductor circuits each having a different pin construction.

9. The apparatus as recited in claim 6 further comprising user interface means for interfacing a user with said data processing means.

10. The apparatus as recited in claim 6 wherein said voltage supply means comprises a plurality of voltage supply circuits, said apparatus further comprising multiplexing means responsive to said select signal for selectively coupling said plurality of voltage supply circuits to the device node.

11. The apparatus as recited in claim 6 wherein said voltage supply means further means comprises multiplexing means responsive to said select signal for coupling and decoupling said voltage supply means to said device node.

12. The apparatus as recited in claim 6 wherein said bypass node means comprises first and second bypass nodes and wherein said diode means comprises first and second diodes having respective first and second anodes and respective first and second cathodes wherein said first and second diodes are constructed to conduct current from said first and second anodes to said first and second cathodes when the potential of said first and second anodes is greater than the potential of said first and second cathodes, said first diode having said first anode coupled to said first bypass node and said first cathode coupled to the device node and said second diode having said second cathode coupled to said second bypass node and said second anode coupled to the device node so that when said electrical source means supplies current to said first and second bypass nodes said first and second diodes conduct the current and said capacitance means stores charge and so that when said first and second electrical source means provides a potential difference between said first and second bypass nodes, said first and second diodes substantially prevent conduction of current.

13. The apparatus as recited in claim 12 wherein said capacitance means comprises first and second discrete capacitors each having first and second leads, said first leads of said first and second discrete capacitors being respectively coupled to said first and second bypass nodes, said second leads of said first and second discrete capacitors each being coupled to the reference potential.

14. The apparatus as recited in claim 13 wherein said electrical source means comprises:

first and second current supply means for supplying respective first and second electrical currents wherein said first and second electrical currents have opposite polarity and substantially the same magnitude; and first and second voltage supply means for supplying respective first and second electrical voltages.

* * * * *